(12) United States Patent
Lee et al.

(10) Patent No.: US 8,076,712 B2
(45) Date of Patent: Dec. 13, 2011

(54) SEMICONDUCTOR MEMORY COMPRISING DUAL CHARGE STORAGE NODES AND METHODS FOR ITS FABRICATION

(75) Inventors: Chungho Lee, Sunnyvale, CA (US);
Ashot Melik-Martirosian, Sunnyvale, CA (US); Wei Zheng, Santa Clara, CA (US); Timothy Thurgate, Sunnyvale, CA (US); Chi Chang, Saratoga, CA (US); Hiroyuki Kinoshita, San Jose, CA (US); Kuo-Tung Chang, Saratoga, CA (US); Unsoon Kim, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 16 days.

(21) Appl. No.: 12/840,165

(22) Filed: Jul. 20, 2010

(65) Prior Publication Data
US 2010/0283100 A1  Nov. 11, 2010

Related U.S. Application Data

(62) Division of application No. 11/613,513, filed on Dec. 20, 2006, now Pat. No. 7,767,517.

(51) Int. Cl.
*H01L 29/788* (2006.01)

(52) U.S. Cl. ........... 257/317; 438/242; 257/E21.681

(58) Field of Classification Search .......... 257/315, 257/316, 317; 438/241, 242
See application file for complete search history.

(56) References Cited

U.S. PATENT DOCUMENTS

| 6,716,686 | B1 | 4/2004 | Buynoski et al. | |
| 7,399,675 | B2* | 7/2008 | Chindalore et al. | 438/266 |
| 2005/0259475 | A1 | 11/2005 | Forbes | |
| 2006/0273404 | A1 | 12/2006 | Scheuerlein | |

FOREIGN PATENT DOCUMENTS
WO  2006130801 A2  12/2006

* cited by examiner

*Primary Examiner* — Jarrett Stark
*Assistant Examiner* — John M Parker

(57) ABSTRACT

A dual charge storage node memory device and methods for its fabrication are provided. In one embodiment a dielectric plug is formed comprising a first portion recessed into a semiconductor substrate and a second portion extending above the substrate. A layer of semiconductor material is formed overlying the second portion. A first layered structure is formed overlying a first side of the second portion of the dielectric plug, and a second layered structure is formed overlying a second side, each of the layered structures overlying the layer of semiconductor material and comprising a charge storage layer between first and second dielectric layers. Ions are implanted into the substrate to form a first bit line and second bit line, and a layer of conductive material is deposited and patterned to form a control gate overlying the dielectric plug and the first and second layered structures.

6 Claims, 5 Drawing Sheets

SEMICONDUCTOR MEMORY COMPRISING DUAL CHARGE STORAGE NODES AND METHODS FOR ITS FABRICATION

CROSS-REFERENCES TO RELATED APPLICATIONS

This application is a divisional of U.S. patent application Ser. No. 11/613,513, filed on Dec. 20, 2006, entitled "Semiconductor Memory Comprising Dual Charge Storage Nodes and Methods for its Fabrication" which is hereby incorporated herein by reference in its entirety.

TECHNICAL FIELD

The present invention generally relates to semiconductor memory devices and to methods for fabricating semiconductor memory devices, and more particularly to dual charge storage node semiconductor memory storage devices and to methods for their fabrication.

BACKGROUND

The majority of present day integrated circuits (ICs) are implemented by using a plurality of interconnected field effect transistors (FETs), also called metal oxide semiconductor field effect transistors (MOSFETs), or simply MOS transistors. An MOS transistor includes a gate electrode as a control electrode and spaced apart source and drain regions between which a current can flow. A control voltage applied to the gate electrode controls the flow of current through a channel between the source and drain regions. The MOS transistor can be used as a semiconductor memory device if some mechanism is available to adjust the threshold voltage (the minimum control voltage necessary to allow current to flow through the channel). A high threshold voltage represents one memory state while a low threshold voltage represents the opposite memory state.

One form of semiconductor memory is a nonvolatile memory in which the memory state of a memory cell is determined by whether or not an electrical charge is stored on a charge storage layer built into the gate structure of a field effect transistor. To enhance the storage capacity of such a nonvolatile memory, two storage nodes can be built into each memory cell. The storage nodes are associated with locations in the charge storage layer at opposite sides of the gate structure. As the capacity of semiconductor memories increases, the size of each individual device that is used to implement the memory shrinks in size. With a memory that uses dual storage nodes per memory cell, the reduction in device size means that the spacing between the two storage nodes of a memory cell decreases. As the spacing between storage nodes decreases, problems arise with respect to the reliability and retention of the memory data. If a single continuous charge storage layer is used for both memory nodes, charge stored in one memory node can leak through the charge storage layer to the other memory node of the memory bit to corrupt the memory stored at that other memory node. Additionally, as device size decreases, programming of one memory node can disturb the data stored in the other memory node due to relatively wide charge distributions in the charge storage layer. Still further, as device sizes decrease, the spacing between bit lines associated with the two memory nodes decreases leading to possible problems with punch through between the bit lines. Such problems limit the possible choices for erasing such dual bit memory cells.

Accordingly, it is desirable to provide a semiconductor memory device having physically split charge storage nodes and to provide methods for its fabrication. In addition, it is desirable to provide a method for fabricating a dual charge storage semiconductor memory device that avoids bit line punch through and allows erasing by Fowler-Nordheim tunneling. Furthermore, other desirable features and characteristics of the present invention will become apparent from the subsequent detailed description and the appended claims, taken in conjunction with the accompanying drawings and the foregoing technical field and background.

BRIEF SUMMARY

Methods are provided for fabricating a dual charge storage node memory. In one embodiment a dielectric plug is formed comprising a first portion partially recessed into a semiconductor substrate and a second portion partially extending above the substrate. A layer of semiconductor material is formed overlying the second portion, and a first layered structure is formed overlying a first side of the second portion of the dielectric plug and a second layered structure is formed overlying a second side, each of the layered structures overlying the layer of semiconductor material and comprising a charge storage layer between first and second dielectric layers. Ions are implanted into the substrate to form a first bit line and second bit line, and a layer of conductive material is deposited and patterned to form a control gate overlying the dielectric plug and the first and second layered structures.

A dual charge storage node memory device is provided in accordance with one embodiment of the invention. The dual charge storage node memory device comprises a semiconductor substrate having a surface. A dielectric plug is recessed into the semiconductor substrate with a first portion below the surface and a second portion extending above the surface, the second portion having a first side, a second side, and a top. A layer of semiconductor material extends over the first side, second side and top of the dielectric plug. A first storage node is formed on the layer of semiconductor material on the first side, and a second storage node is formed on the layer of semiconductor material on the second side. A gate dielectric overlies the layer of semiconductor material on the top, and a control gate overlies the first storage node, the second storage node, and the gate dielectric.

BRIEF DESCRIPTION OF THE DRAWINGS

The present invention will hereinafter be described in conjunction with the following drawing figures, wherein like numerals denote like elements, and wherein FIG. 1 schematically illustrates, in cross section, a dual charge storage node semiconductor memory device in accordance with an embodiment of the invention.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
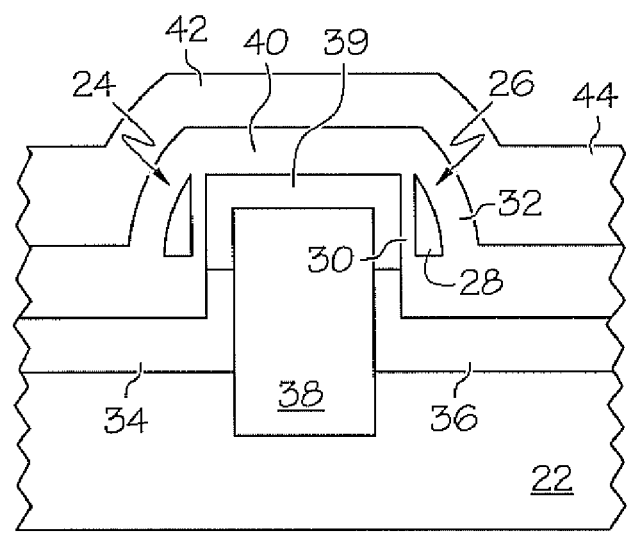

FIG. 1 illustrates schematically, in cross section, a dual charge storage node memory device 20 in accordance with an embodiment of the invention. Memory device 20 is just one of a plurality of memory devices that would be included to make a complete nonvolatile semiconductor memory integrated circuit (IC). Memory device 20 is an MOS transistor fabricated in and on a semiconductor substrate 22. The memory device includes spaced apart charge storage nodes 24 and 26. Each of the charge storage nodes is a layered structure including a charge storage layer 28 sandwiched between dielectric layers 30 and 32. Memory device 22 also includes spaced apart bit lines 34 and 36 formed in the semiconductor substrate. A dielectric plug 38 is partially recessed into semiconductor substrate 22 and separates charge storage nodes 24 and 26 and also separates bit lines 34 and 36. A channel 39 of the MOS transistor is formed over the dielectric plug and a gate dielectric layer 40 is formed overlying the channel. A conductive control gate 42 overlies the gate dielectric and the two charge storage nodes and in turn forms a portion of or is coupled to a word line 44 of the memory device. Dielectric plug 38 blocks bit line punch through even at reduced device sizes and avoids transient pulse disturb. The dielectric plug also separates the two charge storage nodes and avoids dual bit ambiguity caused by channel hot carrier injection and lateral charge diffusion through the layer of charge storage material. The completely separate memory charge storage node structure also helps to avoid complimentary bit disturb.

FIGS. 2-14 schematically illustrate, in cross section, method steps in accordance with various embodiments of the invention for the fabrication of a semiconductor memory 50 similar to dual charge storage node memory device 20 described above. Many of the steps employed in the fabrication of semiconductor devices are well known and so, in the interest of brevity, some of those conventional steps will only be mentioned briefly herein or will be omitted entirely without providing the well known process details.

Figure 2:
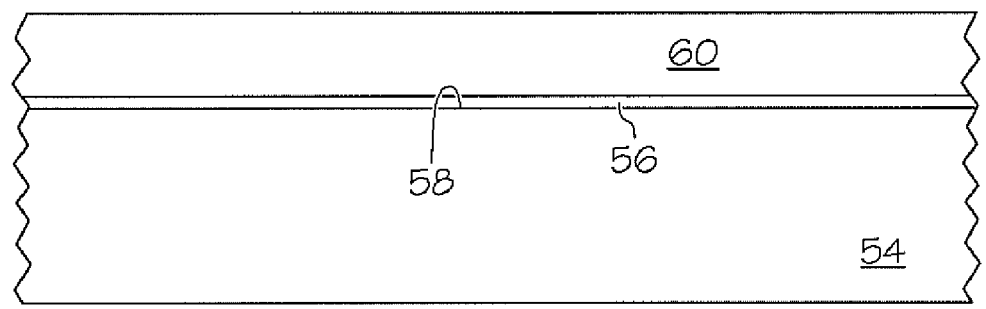
FIGS. 2-14 schematically illustrate, in cross section, method steps for the fabricating a dual charge storage node semiconductor memory in accordance with various embodiments of the invention.

The method begins, as illustrated in FIG. 2, by providing a semiconductor substrate 54. Preferably semiconductor substrate 54 is a monocrystalline silicon substrate and for convenience of discussion but without limitation will hereinafter be referred to as a silicon substrate. As used herein, the term "silicon substrate" will be used to encompass the relatively pure or lightly impurity doped monocrystalline silicon materials typically used in the semiconductor industry as well as silicon admixed with other elements such as germanium, carbon, and the like to form substantially monocrystalline semiconductor material. The silicon substrate can be a bulk silicon wafer as illustrated or can be a thin layer of silicon on an insulator (SOI) that, in turn is supported by a semiconductor carrier substrate. A thin layer of pad oxide 56 is grown at surface 58 of the silicon substrate and a layer of hard mask material 60 is deposited over the pad oxide. The pad oxide can be thermally grown to a thickness of about 1-5 nanometers (nm) and the layer of hard mask material can be deposited to a thickness of about 30-60 nm. The hard mask material is preferably silicon nitride or silicon rich nitride deposited by low pressure chemical vapor deposition (LPCVD) or plasma enhanced chemical vapor deposition (PECVD) by the reaction of dichlorosilane and ammonia.

Figure 3:
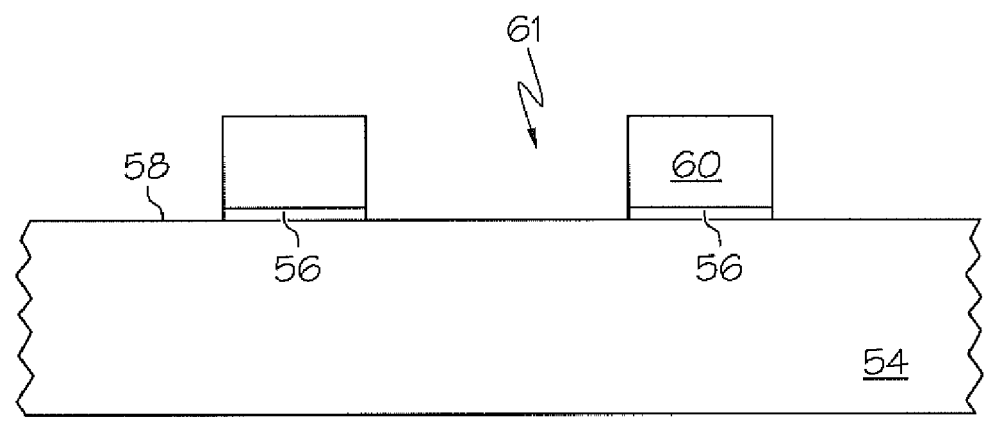
Figure 4:
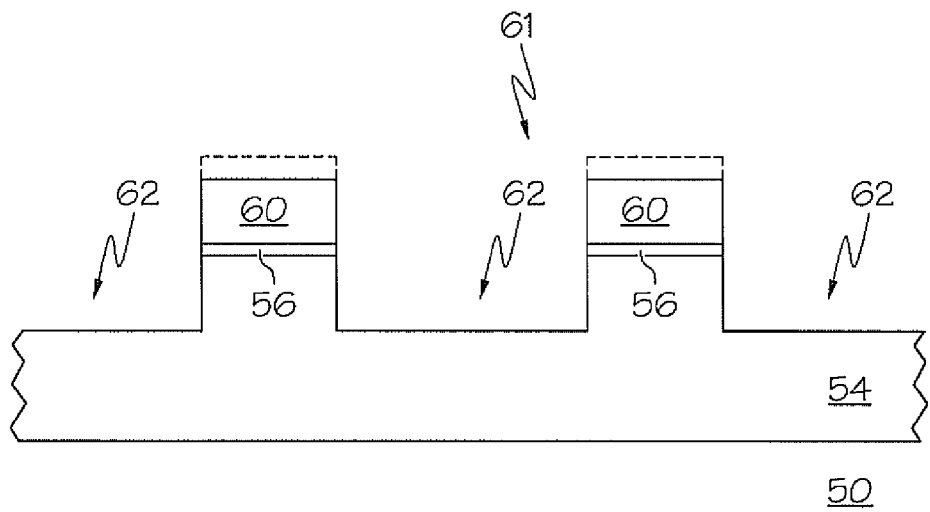

Layer of hard mask material 60 and pad oxide 56 are patterned as illustrated in FIG. 3 to form gaps 61 between adjacent patterned hard mask portions. The patterned hard mask is subsequently used as an etch mask and trenches 62 are etched into the surface of substrate 54 as illustrated in FIG. 4. The etching of the trenches also reduces the thickness of the patterned layer of hard mask material as indicated by dashed lines 64. The hard mask can be etched, for example, by plasma etching in a $CHF_3$, $CF_4$, or $SF_6$ chemistry. Trenches 62 are preferably etched by anisotropic etching such as by reactive ion etching using a Cl or $HBr/O_2$ chemistry. Preferably the trenches have a depth of about 50-80 nm.

Figure 5:
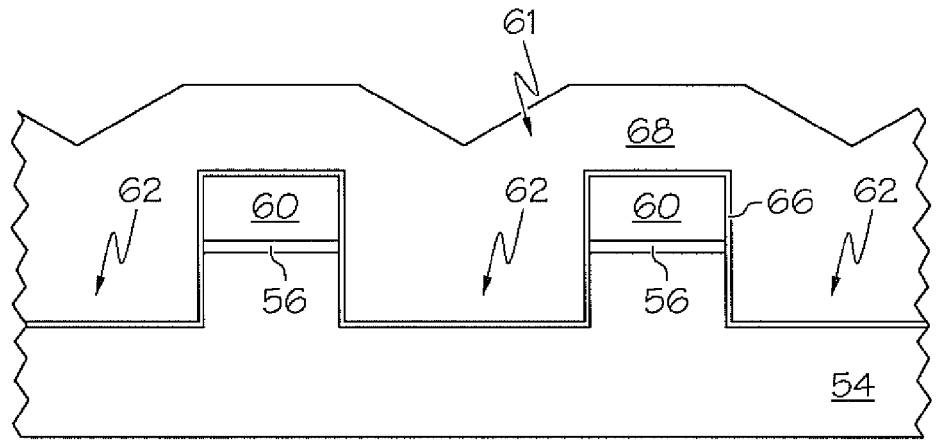

As illustrated in FIG. 5, trenches 62 and gaps 61 are filled with a dielectric material. Preferably a liner oxide 66 is first grown or deposited and then a layer of gap fill dielectric 68 is deposited by high density plasma (HDP) deposition. The gap fill dielectric can be, for example, a silicon oxide formed by the decomposition of tetraethylorthosilicate (TEOS). The gap fill dielectric is deposited to a sufficient thickness to completely fill trenches 62 and gaps 61.

Figure 6:
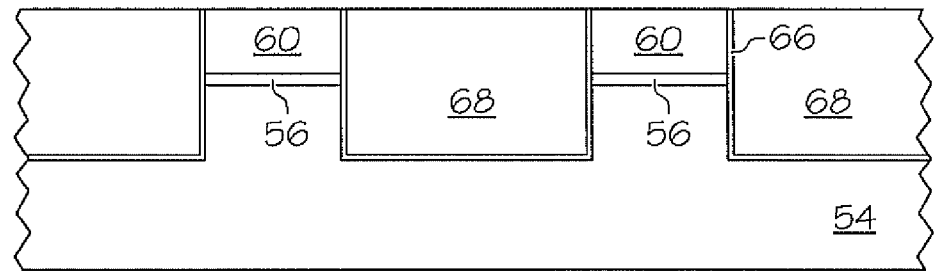
Figure 7:
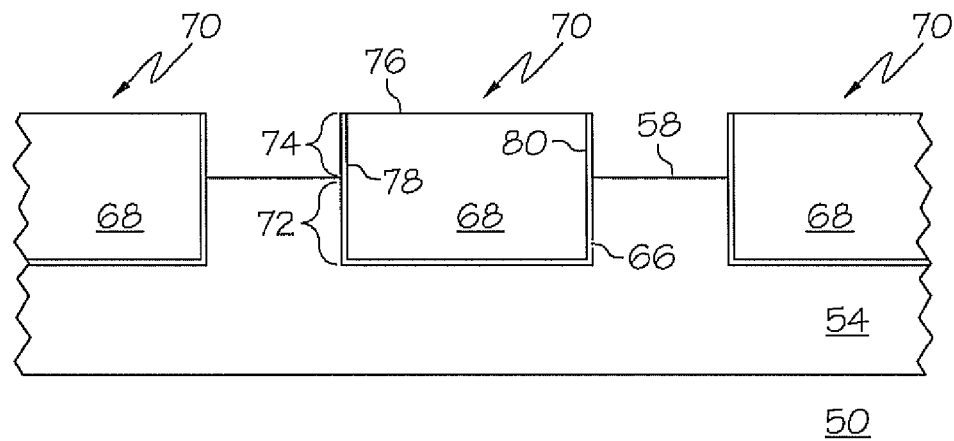

The gap fill dielectric is planarized, for example by chemical mechanical planarization (CMP), as illustrated in FIG. 6. Patterned hard mask material 60 can be used as a CMP stop layer during the planarization. Following the planarization of gap fill dielectric 68, patterned hard mask material 60 and pad oxide 56 are removed as illustrated in FIG. 7. The hard mask material can be removed, for example, by etching in hot phosphoric acid and the pad oxide can be removed by a dip in dilute hydrofluoric acid. The structure as illustrated in FIG. 7 now includes a dielectric plug 70 formed from the gap fill dielectric material 68 that includes a recessed portion 72 extending into substrate 54 beneath surface 58 and an elevated portion 74 that extends above surface 58. The elevated portion has a top 76 and opposing sides 78 and 80.

Figure 8:
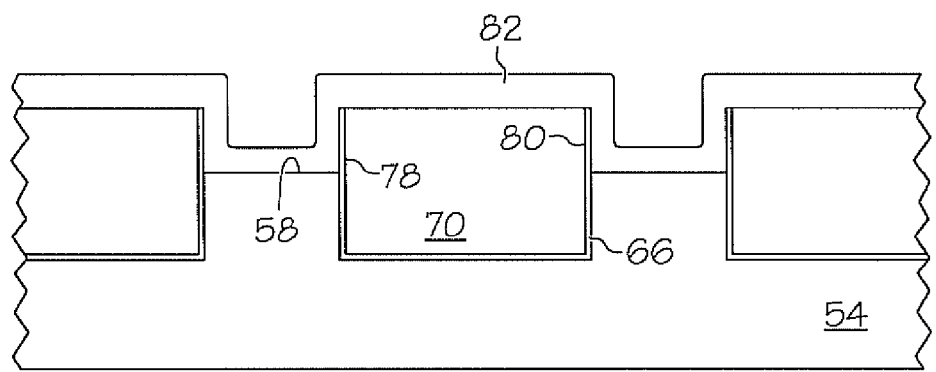

A layer of semiconductor material 82 is formed over the exposed portion of surface 58 of semiconductor substrate 54 and over dielectric plug 70 as illustrated in FIG. 8. In accordance with one embodiment of the invention the layer of semiconductor material can be a layer of monocrystalline silicon grown by a process of selective epitaxial growth using monocrystalline silicon substrate 54 as a nucleating site for the monocrystalline growth. In accordance with an alternate embodiment of the invention the layer of semiconductor material can be deposited, for example by chemical vapor deposition (CVD), LPCVD, or physical vapor deposition (PVD), as a layer of polycrystalline or amorphous silicon. The layer of polycrystalline or amorphous silicon can subsequently be heated to cause recrystallization as monocrystalline silicon, again using the exposed portion of monocrystalline silicon substrate 54 as a nucleating site for the recrystallization. The layer of semiconductor material is preferably grown to a thickness of about 18-24 nm. The layer of semiconductor material, which will hereinafter be referred to for convenience but without limitation as a silicon layer, will form the channel of the MOS transistor.

Figure 9:
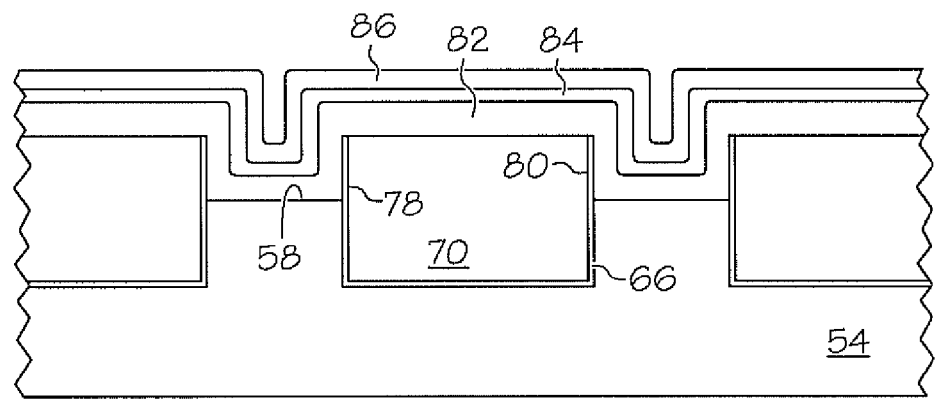

The method continues, in accordance with one embodiment of the invention, by forming a layer of tunnel dielectric 84 overlying silicon layer 82. A layer of charge storage material 86 is deposited over the layer of tunnel dielectric as illustrated in FIG. 9. Preferably the layer of tunnel dielectric is a layer of silicon dioxide having a thickness of about 1-5 nm grown by the thermal oxidation of the surface of the silicon layer. The layer of charge storage material can be, for example, silicon nitride, silicon rich nitride, or polycrystalline silicon. Silicon rich nitride is a silicon nitride for which the silicon content is greater than the silicon content of stoichiometric silicon nitride ($Si_3N_4$). Silicon rich nitride is more conductive than stoichiometric silicon nitride and tends to have shallower trap energy levels and higher trap density, both of which allow electrons to move easily to enable Fowler-Nordheim erasure of the memory storage node. The charge storage layer can be deposited, for example by LPCVD to a thickness of preferably about 4-12 nm. If the charge storage layer is silicon nitride or silicon rich nitride, the layer can be deposited, for example, by the reaction of dichlorosilane ($SiH_2Cl_2$) and ammonia. If the charge storage layer is polycrystalline silicon, the layer can be deposited by, for example, the reduction of silane ($SiH_4$).

Figure 10:
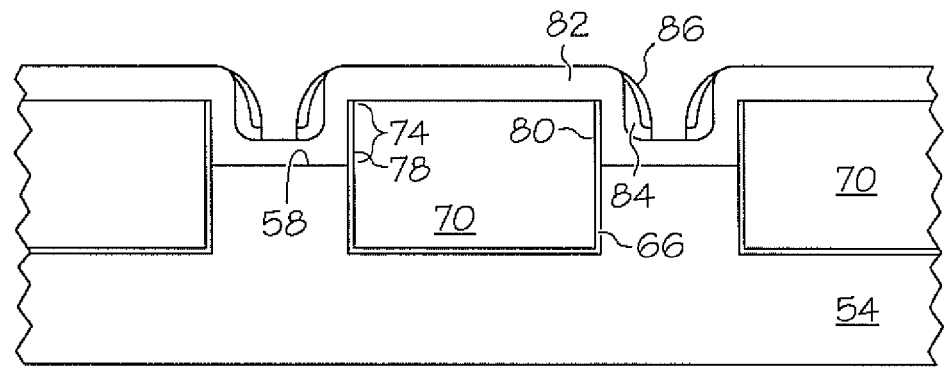

As illustrated in FIG. 10, layer of charge storage material 86 and the underlying layer of tunnel dielectric 84 are anisotropically etched to form discrete portions of the layers on silicon layer 82 at the opposing sides 78 and 80 of elevated portion 74 of dielectric plug 70. Layers 86 and 84 can be etched, for example, by reactive ion etching in a $CHF_3$, $CF_4$, or $SF_6$ chemistry. The anisotropic etching removes layers 86 and 84 from the substantially horizontal portions of silicon layer 82.

Figure 11:
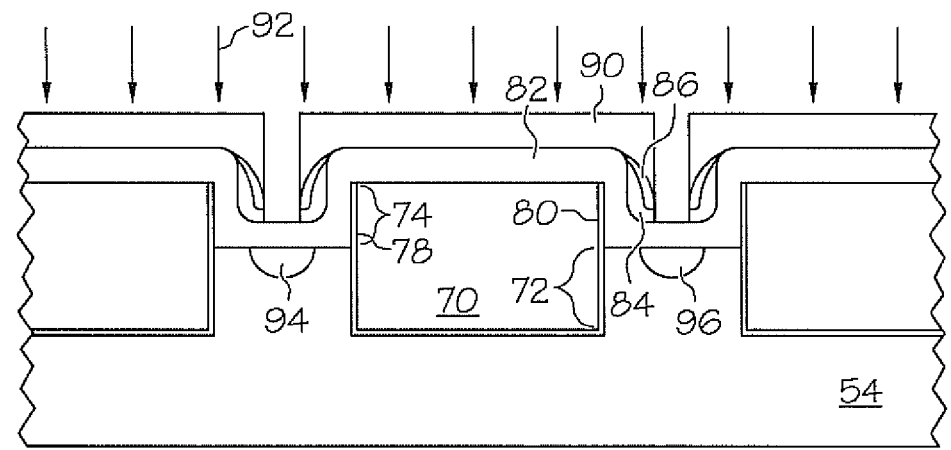

A layer of photoresist 90 is applied to the device structure and is patterned and developed as illustrated in FIG. 11. The patterned photoresist layer is used as an ion implantation mask and conductivity determining ions such as arsenic or phosphorous ions are implanted into the exposed portions of silicon layer 82 and through that layer and into substrate 54 as illustrated by arrows 92. The implanted ions form bit lines 94 and 96 on opposite sides of dielectric plug 70. Even after subsequent oxidation and thermal annealing steps the implanted bit lines preferably extend into the substrate for a depth less than the depth of recessed portion 72 of dielectric plug 70. Dielectric plug 70 thus serves to separate and isolate the two bit lines and to prevent punch through from one bit line to the other during programming and erase cycles.

Figure 12:
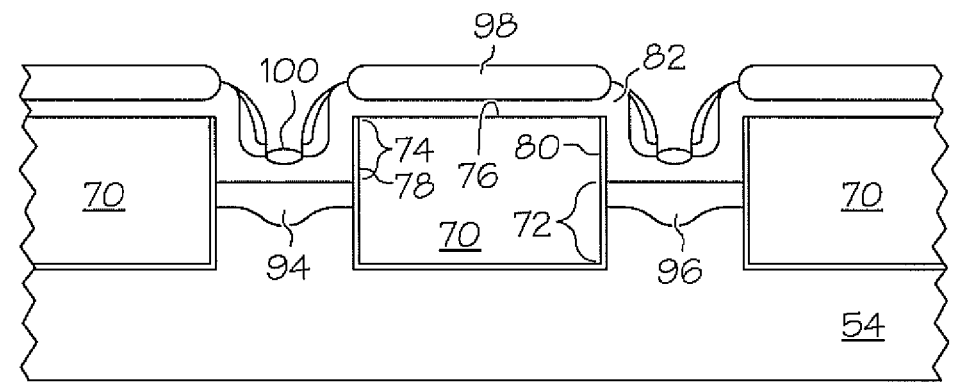

Photoresist layer 90 is removed and the exposed portions of silicon layer 82 are oxidized to form a gate insulator 98 on the upper surface of silicon layer 82 overlying top surface 76 of elevated portion 74 of dielectric plug 70. The oxidation also forms a layer of oxide 100 on the portion of silicon layer 82 overlying bit lines 94 and 96 as illustrated in FIG. 12. Preferably gate insulator 98 has a thickness of about 14-18 nm to withstand high voltages (for example greater than negative 18 volts) that may be applied during channel erase. The thermal oxidation to form the layer of oxide is also employed as one thermal step used to redistribute or drive in the conductivity determining ions forming bit lines 94 and 96.

Figure 13:
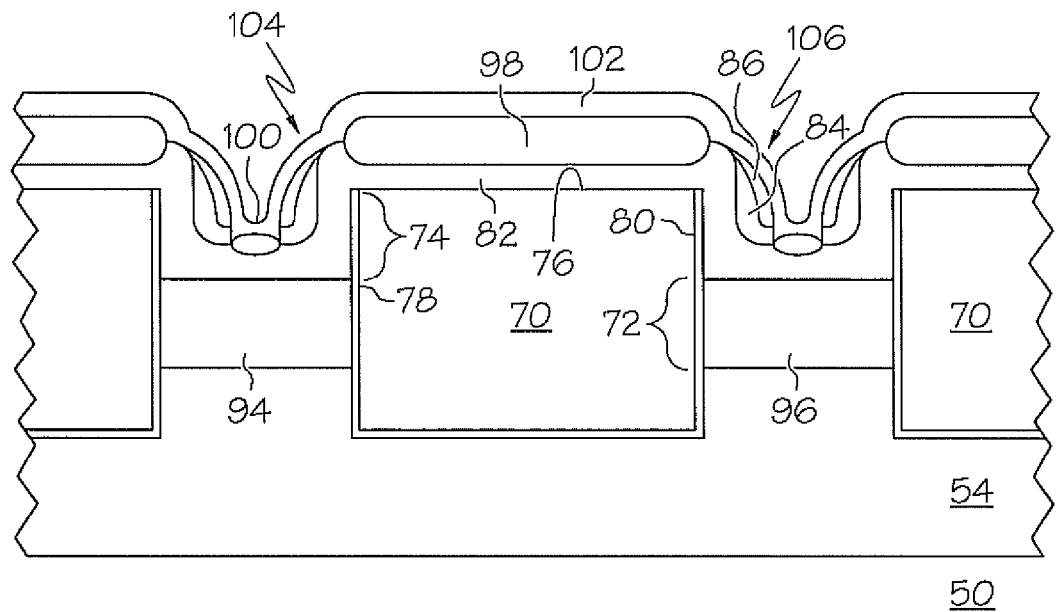

A top layer of dielectric 102 is deposited over the portions of charge storage layer 86 on the edges of dielectric plug 70 to complete O-R-O memory storage structures 104 and 106 overlying silicon layer 82 on opposite sides of the dielectric plug as illustrated in FIG. 13. The first "O" is tunneling dielectric layer 84, the "R" is charge storage layer 86, and the second "O" of the O-R-O, dielectric layer 102, can be a silicon oxide or a high dielectric constant (high-K) insulator such as HfSiO, or the like. As is well known, a high-K dielectric material is generally considered to be one having a dielectric constant greater than the dielectric constant of silicon dioxide. Preferably layer 102 is deposited by LPCVD to a thickness of about 4-15 nm. Although not illustrated, layer 102 can also be a multi-layered structure such as formed of a layer of silicon oxide together with a layer of high-K dielectric material. The deposition of dielectric layer 102 is preferably followed by a thermal densification step that further redistributes or drives in the conductivity determining ions forming bit lines 94 and 96. The bit lines generally extend from one dielectric plug to the next, but preferably do not extend into substrate 54 to a depth greater than the recessed portion 72 of dielectric plug 70.

Figure 14:
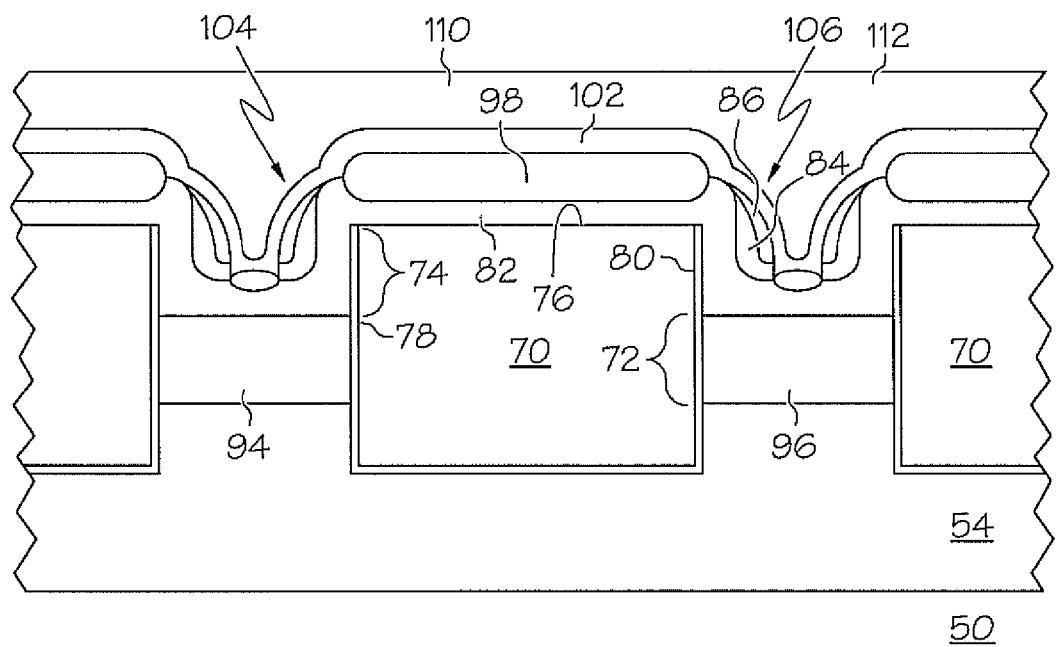

The memory device is completed as illustrated in FIG. 14 by the deposition and patterning of a layer 110 of a conductive material such as polycrystalline silicon to form a control gate overlying gate insulator 98 and charge storage nodes 104 and 106. The layer of conductive material also forms a word line 112 connecting each of the control gates.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A semiconductor memory device comprising:
    a semiconductor substrate having a surface;
    a dielectric plug having a first portion extending below the surface and a second portion extending above the surface wherein the second portion has a first side, a second side, and a top;
    a layer of semiconductor material extending over the first side, the second side and the top of the dielectric plug;
    a first storage node formed on the layer of semiconductor material extending over the first side, and a second storage node formed on the layer of semiconductor material extending over the second side;
    a gate dielectric overlying the layer of semiconductor material extending over the top; and
    a control gate overlying the first storage node, the second storage node, and the gate dielectric.

2. The semiconductor device of claim 1 comprising a layer of gate insulating material overlying the layer of semiconductor material.

3. The semiconductor memory device of claim 1 comprising:
    a layer of tunnel oxide overlying the layer of semiconductor material;
    a layer of charge storage material overlying the layer of tunnel oxide; and
    a second dielectric layer overlying the charge storage material.

4. The semiconductor device of claim 1 wherein the charge storage material comprises a layer of silicon rich nitride.

5. The semiconductor device of claim 1 comprising:
    a trench extending into the semiconductor substrate; and
    a dielectric fill material filling the trench.

6. The semiconductor device of claim 1 wherein the layer of semiconductor material comprises a layer of monocrystalline semiconductor material.

* * * * *